(12) United States Patent
Li

(10) Patent No.: US 7,602,612 B2
(45) Date of Patent: Oct. 13, 2009

(54) SWAPPABLE ELECTRONIC DEVICE HAVING LOCKING ELEMENT

(75) Inventor: Ran Li, Amphur Muang (TH)

(73) Assignee: Delta Electronics (Thailand) Public Co., Ltd., Amphur Muang (TH)

( * ) Notice: Subject to any disclaimer, the term of this patent is extended or adjusted under 35 U.S.C. 154(b) by 193 days.

(21) Appl. No.: 11/776,308

(22) Filed: Jul. 11, 2007

(65) Prior Publication Data

US 2008/0266817 A1 Oct. 30, 2008

(30) Foreign Application Priority Data

Apr. 27, 2007 (TW) .............................. 96115177 A

(51) Int. Cl.
*H05K 7/00* (2006.01)
(52) U.S. Cl. ..................... 361/747; 361/801; 361/802
(58) Field of Classification Search ................. 361/801, 361/802, 752, 800, 790, 797, 747
See application file for complete search history.

(56) References Cited

U.S. PATENT DOCUMENTS 6,445,586 B1 * 9/2002 Chou ........................ 361/725
6,762,934 B2 * 7/2004 Kitchen et al. ......... 361/679.58

* cited by examiner

*Primary Examiner*—Hung S Bui
(74) *Attorney, Agent, or Firm*—Kirton & McConkie; Evan R. Witt

(57) ABSTRACT

An electronic device swappable to be embedded into a system cabinet includes a casing and a locking element. The casing includes a first sidewall and a second sidewall, which have a first opening and a second opening, respectively. The locking element includes a first end part, a protrusion part, a bent part and a second end part. The first end part is fixed on an inner surface of the second sidewall of the casing. The protrusion part is partially exposed from the second opening to be engaged with a receiving structure of the system cabinet. The bent part is arranged between the first end part and the protrusion part. The second end part is exposed from the first opening so as to be protruded from the first sidewall of the casing.

18 Claims, 5 Drawing Sheets

SWAPPABLE ELECTRONIC DEVICE HAVING LOCKING ELEMENT

FIELD OF THE INVENTION

The present invention relates to a swappable electronic device, and more particularly to a swappable electronic device having a locking element.

BACKGROUND OF THE INVENTION

Power supply apparatuses are essential for many electronic appliances such as personal computers, industrial computers, servers, communication products or network products. Normally, the power supply apparatus may provide stable electricity to the electronic appliance. In a case that the power supply apparatus has a breakdown, the electronic appliance is possibly damaged or the data stored in the electronic appliance is lost. For enhancing capacity and reliability of power supply, a redundant power supply system has been proposed. The redundant power supply system includes a plurality of separated power supply apparatuses, which are electrically to each other and contained in a system cabinet. During operation of the redundant power supply system, individual power supply apparatuses share responsibility for providing electricity to the electronic appliance. If one of the power supply apparatuses has a breakdown and fails to normally provide electricity, the others could continuously provide electricity to the loads.

Referring to FIG. 1, a schematic exploded view of a conventional redundant power supply system is illustrated. The redundant power supply system 1 principally includes a system cabinet 10, a first power supply apparatus 11 and a second power supply apparatus 12. The system cabinet 10 includes a first receptacle 102 and a second receptacle 103, which are separated by a partition plate 101. The first power supply apparatus 11 and the second power supply apparatus 12 are accommodated within the first receptacle 102 and the second receptacle 103, respectively. The redundant power supply system 1 further includes a backside plate 13 inside the system cabinet 10. A first insertion slot 131 and a second insertion slot 132 are disposed on the backside plate 13. A first power connection interface 111 of the first power supply apparatus 11 and a second power connection interface 121 of the second power supply apparatus 12 are respectively inserted into the first insertion slot 131 and the second insertion slot 132 so as to be electrically connected to the backside plate 13. A power cable 14 is extended from the outer surface of the backside plate 13, so that the electricity provided by the redundant power supply system 1 is transmitted to an electronic appliance via the power cable 14.

Referring to FIG. 2, a schematic perspective view of the first power supply apparatus of FIG. 1 is illustrated. The configuration of the second power supply apparatus 12 is substantially identical to that of the first power supply apparatus 11. For clarification and brevity, only the first power supply apparatus 11 is described.

As shown in FIGS. 1 and 2, the first power supply apparatus 11 is swappable to be embedded into the first receptacle 102 of the system cabinet 10. The first power supply apparatus 11 principally includes a casing 110, a connecting part 111, a resilient piece 115, a power socket 117, a handle 118 and a switch element 119. The casing 110 includes a first sidewall 112 and a second sidewall 113, which are adjacent to each other.

The power socket 117, the handle 118 and the switch element 119 are positioned on the first sidewall 112 of the casing 110. The first sidewall 112 and the second sidewall 113 further include a first opening 114 and a second opening 116, respectively. In response to a pulling force exerted on the handle 118, the first power supply apparatus 11 may be withdrawn from the system cabinet 10 of the redundant power supply system 1. In a case that a power plug (not shown) is inserted into the power socket 117, external electricity will be transmitted to the power socket 117 through an external power cable (not shown) and the plug. The switch element 119 is arranged between the resilient piece 115 and the power socket 117 for controlling either conduction or interruption of the external electricity. The resilient piece 115 includes a first end part 115a, a second end part 115b and a protrusion part 115c. The protrusion part 115c is arranged between the first end part 115a and the second end part 115b. The first end part 115a is fixed on the inner surface of the second sidewall 113 of the casing 110. The protrusion part 115c is partially exposed from the second opening 116. The second end part 115b of the resilient piece 115 is exposed from the first opening 114 of the first sidewall 112 of the casing 110. As a consequence, the second end part 115b is served as a suppression part to be pressed by the user.

Please refer to FIGS. 1 and 2 again. When the first power supply apparatus 11 is placed into the system cabinet 10 of the redundant power supply system 1, the protrusion part 115c of the resilient piece 115 is engaged with the recess structure 104 of the system cabinet 10 such that the first power supply apparatus 11 is fixed in the system cabinet 10. For a purpose of withdrawing the first power supply apparatus 11, an external force is exerted on the second end part 115b of the resilient piece 115 (i.e. the suppression part) to have the protrusion part 115c sunken under the second opening 116. Meanwhile, the protrusion part 115c of the resilient piece 115 is disengaged from the recess structure 104 of the system cabinet 10, so that the first power supply apparatus 11 may be pulled out of the system cabinet 10 in response to a pulling force exerted on the handle 118.

The conventional redundant power supply system, however, still has some drawbacks. For example, since the resilient piece 115 is substantially an integral metallic flat plate, the resilient piece 115 is readily subject to distortion after the frequent pressing actions of the resilient piece 115. Especially, the intermediate portion between the first end part 115a and the protrusion part 115c has the highest tendency toward distortion. In a long-term period, the protrusion part 115c of the distorted resilient piece 115 may fail to be effectively engaged with the recess structure 104 of the system cabinet 10, and thus the locking effect is impaired. Moreover, during the power plug is inserted into the power socket 117 to supply the external electricity to the redundant power supply system 1, the protrusion part 115c of the resilient piece 115 may be disengaged from the recess structure 104 of the system cabinet 10 upon carelessly pressing the second end part 115b of the resilient piece 115. Under this circumstance, the first power supply apparatus 11 may be erroneously pulled out of the system cabinet 10.

In views of the above-described disadvantages resulted from the conventional method, the applicant keeps on carving unflaggingly to develop swappable electronic device having a locking element according to the present invention through wholehearted experience and research.

SUMMARY OF THE INVENTION

It is an object of the present invention to provide a swappable electronic device having a locking element, which may maintain sufficient elasticity even if a long-term or frequent locking and unlocking actions, thereby avoiding the problem of causing distortion.

Another object of the present invention provides a swappable electronic device having a foolproof mechanism for avoiding erroneously withdrawing the power supply apparatus during external electricity is transmitted to the power socket.

It is a further object of the present invention to provide a swappable power supply apparatus for used in a redundant power supply system, in which a locking element of the power supply apparatus may maintain sufficient elasticity even if a long-term or frequent locking and unlocking actions so as to avoid the problem of causing distortion.

In accordance with an aspect of the present invention, there is provided an electronic device swappable to be embedded into a system cabinet. The electronic device includes a casing and a locking element. The casing includes a first sidewall and a second sidewall, which have a first opening and a second opening, respectively. The locking element includes a first end part, a protrusion part, a bent part and a second end part. The first end part is fixed on an inner surface of the second sidewall of the casing. The protrusion part is partially exposed from the second opening to be engaged with a receiving structure of the system cabinet. The bent part is arranged between the first end part and the protrusion part. The second end part is exposed from the first opening so as to be protruded from the first sidewall of the casing.

In accordance with another aspect of the present invention, there is provided an electronic device swappable to be embedded into a system cabinet. The electronic device includes a casing, a locking element and a power socket. The system cabinet includes a receiving structure. The electronic device includes a casing and a locking element. The casing includes a first sidewall and a second sidewall, which have a first opening and a second opening, respectively. The locking element includes a first end part, a protrusion part, a bent part and a second end part. The first end part is fixed on an inner surface of the second sidewall of the casing. The protrusion part is partially exposed from the second opening to be engaged with a receiving structure of the system cabinet. The bent part is arranged between the first end part and the protrusion part. The second end part is exposed from the first opening so as to be protruded from the first sidewall of the casing. The power socket is disposed in the first sidewall of the casing and beside the locking element. When a power plug is inserted into the power socket, the locking element is sustained against the power plug.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention relates to a swappable electronic device having a locking element. The swappable electronic device is swappable to be embedded into a system cabinet of a redundant power supply system in order to transmit electricity. By engaging/disengaging the locking element with/from a corresponding receiving structure of the system cabinet, the locking or unlocking function will be achieved as required. The swappable electronic device of the present invention includes but is not limited to a swappable power supply apparatus, a swappable hard disc or a swappable optical disc drive. Hereinafter, the present invention is illustrated by referring to a swappable power supply apparatus used in a redundant power supply system.

Figure 1:
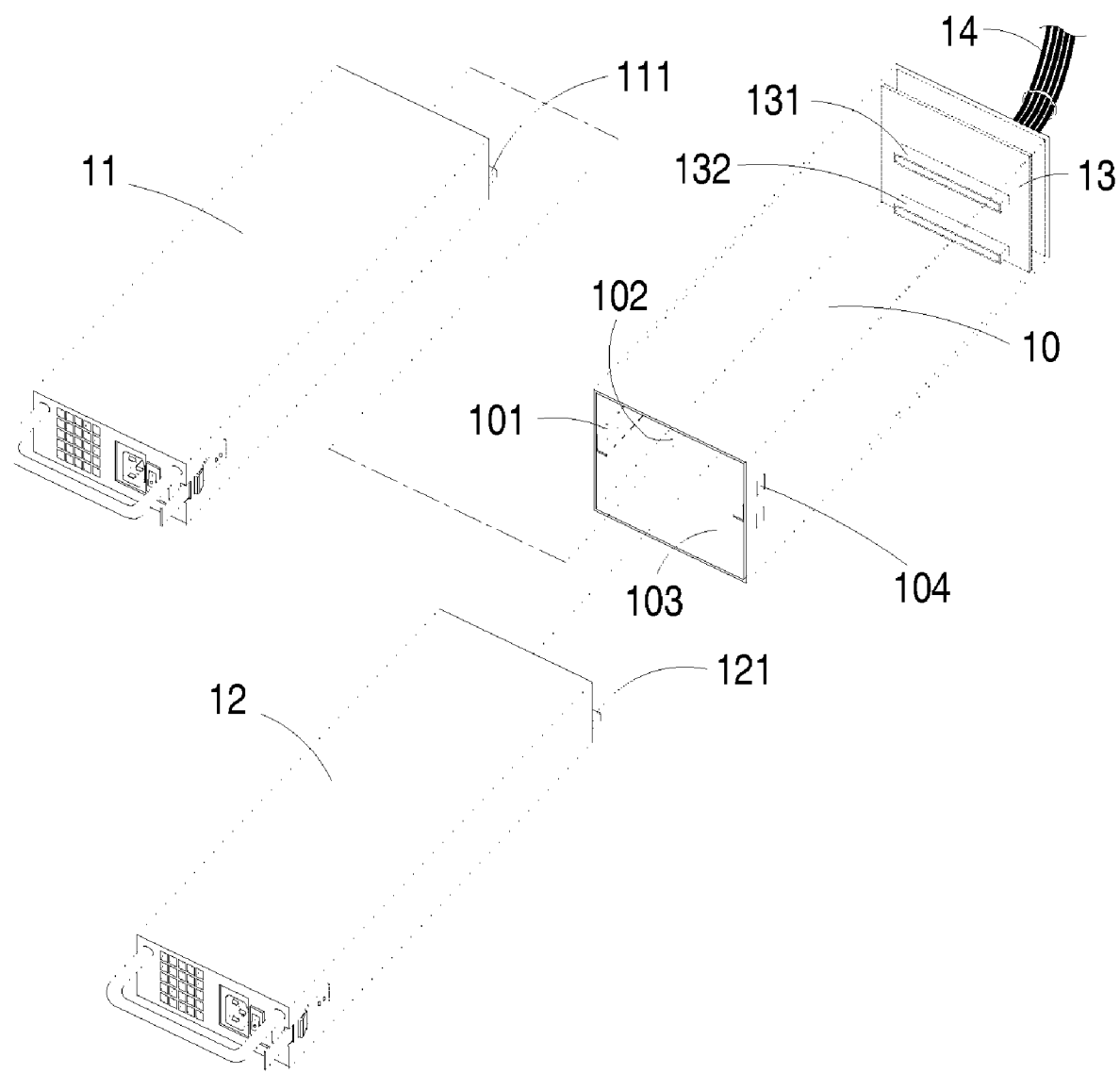
FIG. 1, a schematic exploded view of a conventional redundant power supply system.
Figure 2:
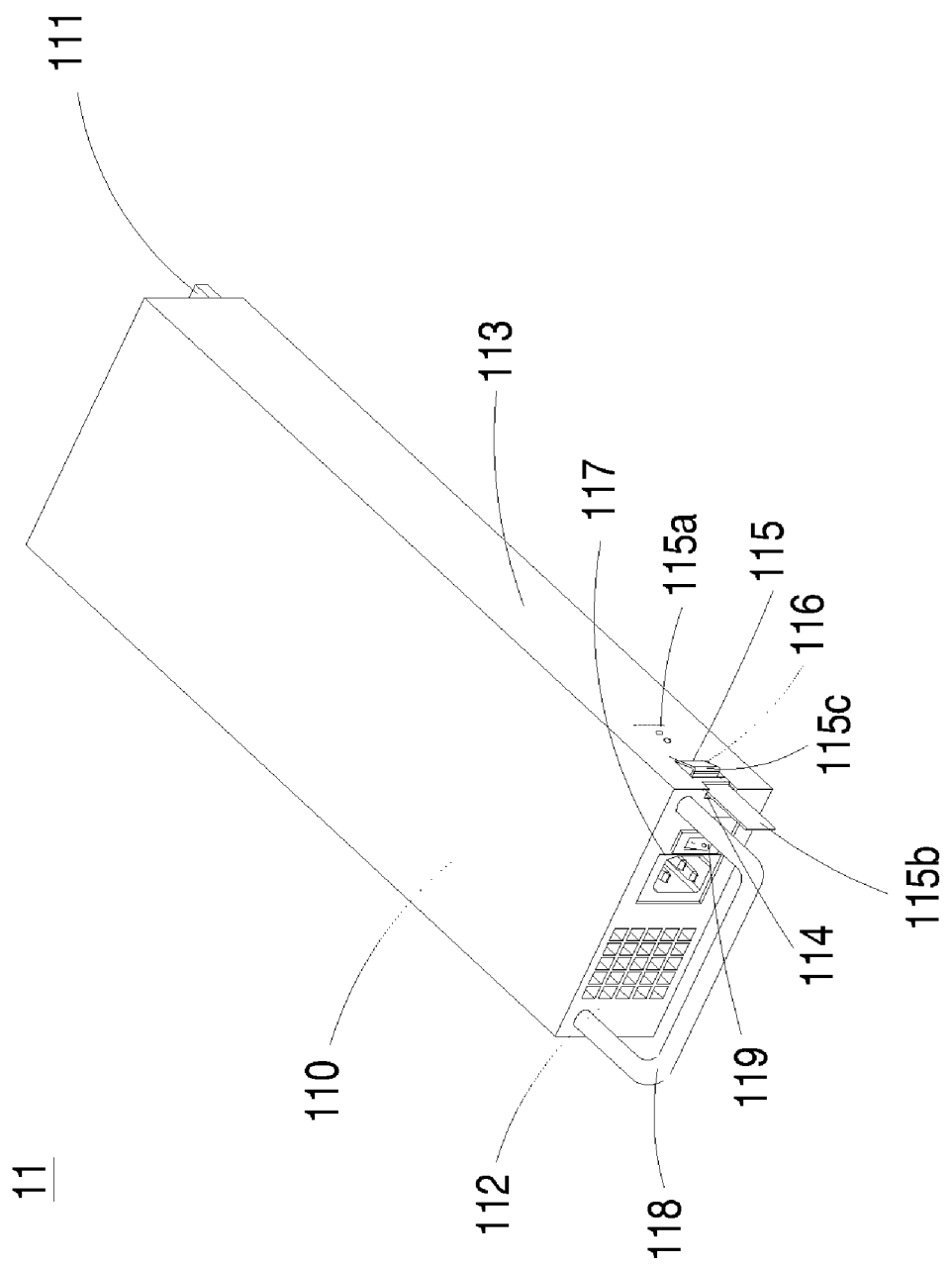
FIG. 2 is a schematic perspective view of the first power supply apparatus of FIG. 1.
Figure 3:
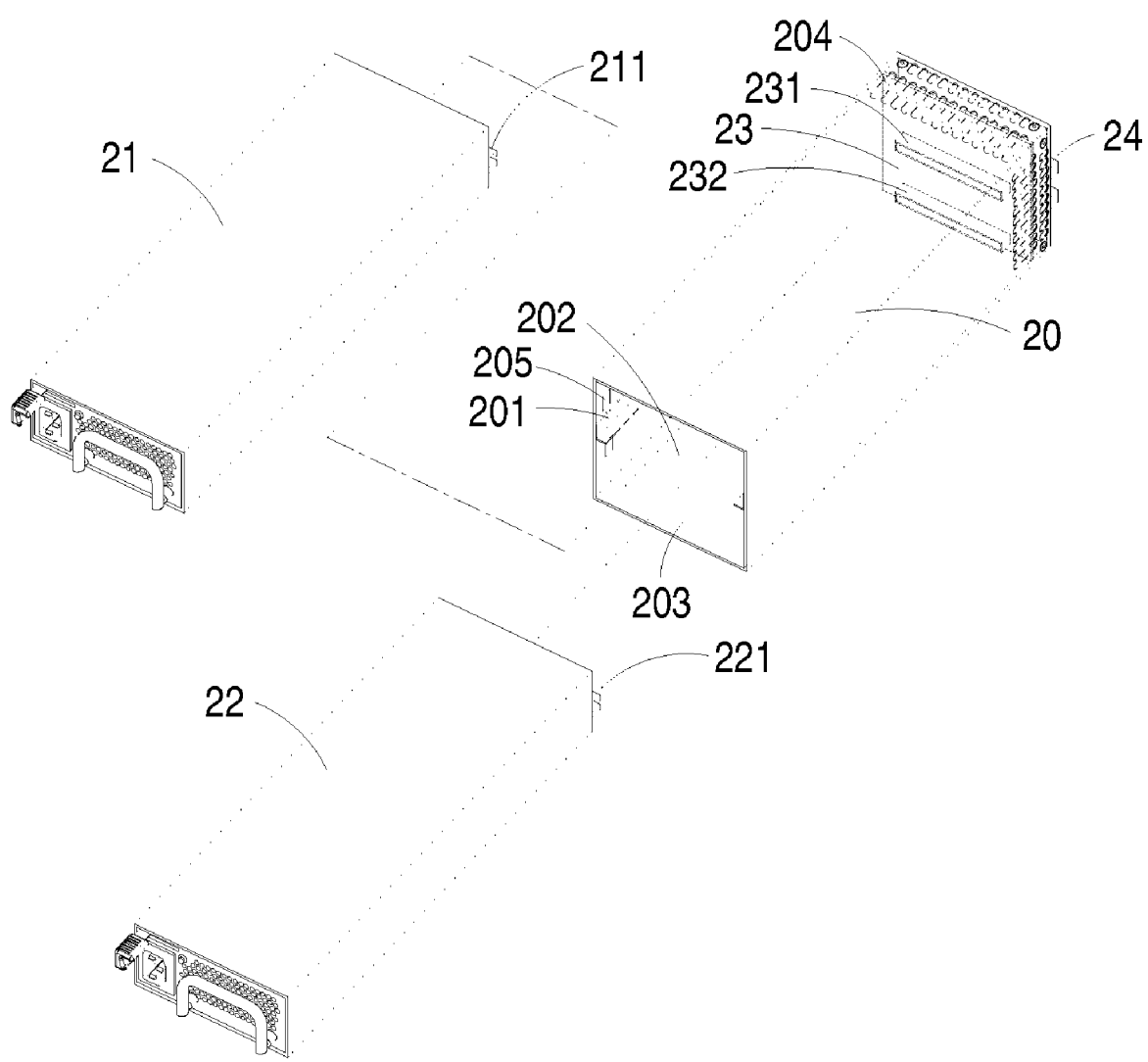
FIG. 3 is a schematic exploded view of a redundant power supply system according to a preferred embodiment of the present invention.

Referring to FIG. 3, a schematic exploded view of a redundant power supply system according to a preferred embodiment of the present invention is illustrated. The redundant power supply system 2 principally includes a system cabinet 20, a first power supply apparatus 21 and a second power supply apparatus 22. The system cabinet 20 includes a first receptacle 202 and a second receptacle 203, which are separated by a partition plate 201. The first power supply apparatus 21 and the second power supply apparatus 22 are swappable to be embedded into the receptacles 202 and 203, respectively. The redundant power supply system 2 further includes a power converting circuit board 23 inside the system cabinet 20. For example, the power converting circuit board 23 include a DC/DC converting circuit. The power converting circuit board 23 is disposed on the inner surface of the backside of the system cabinet 20 and substantially perpendicular to the length direction of the system cabinet 20. The power converting circuit board 23 further includes a first insertion slot 231 and a second insertion slot 232, which are mounted on a first surface of the power converting circuit board 23. The first connection interface 211 of the first power supply apparatus 21 and the second connection interface 221 of the second power supply apparatus 22 are respectively inserted into the first insertion slot 231 and the second insertion slot 232 so as to be electrically connected to the power converting circuit board 23. In some embodiments, the first connection interface 211 and the second connection interface 221 are edge connectors, which are respectively disposed at edges of circuit boards (not shown) inside the first power supply apparatus 21 and the second power supply apparatus 22. At least a surface of the system cabinet 20 further includes plural ventilation holes 204 in the vicinity of the power converting circuit board 23. The airflow inhaled by the fans inside the first power supply apparatus 21 and the second power supply apparatus 22 may also remove a portion of heat from the power converting circuit board 23, and the heated air is exhausted through the ventilation holes 204 in order to enhance the heat-dissipating efficiency. Moreover, an electronic connector 24 is mounted on the backside of the power converting circuit board 23 and employed to couple with an external electronic appliance (not shown).

Figure 4:
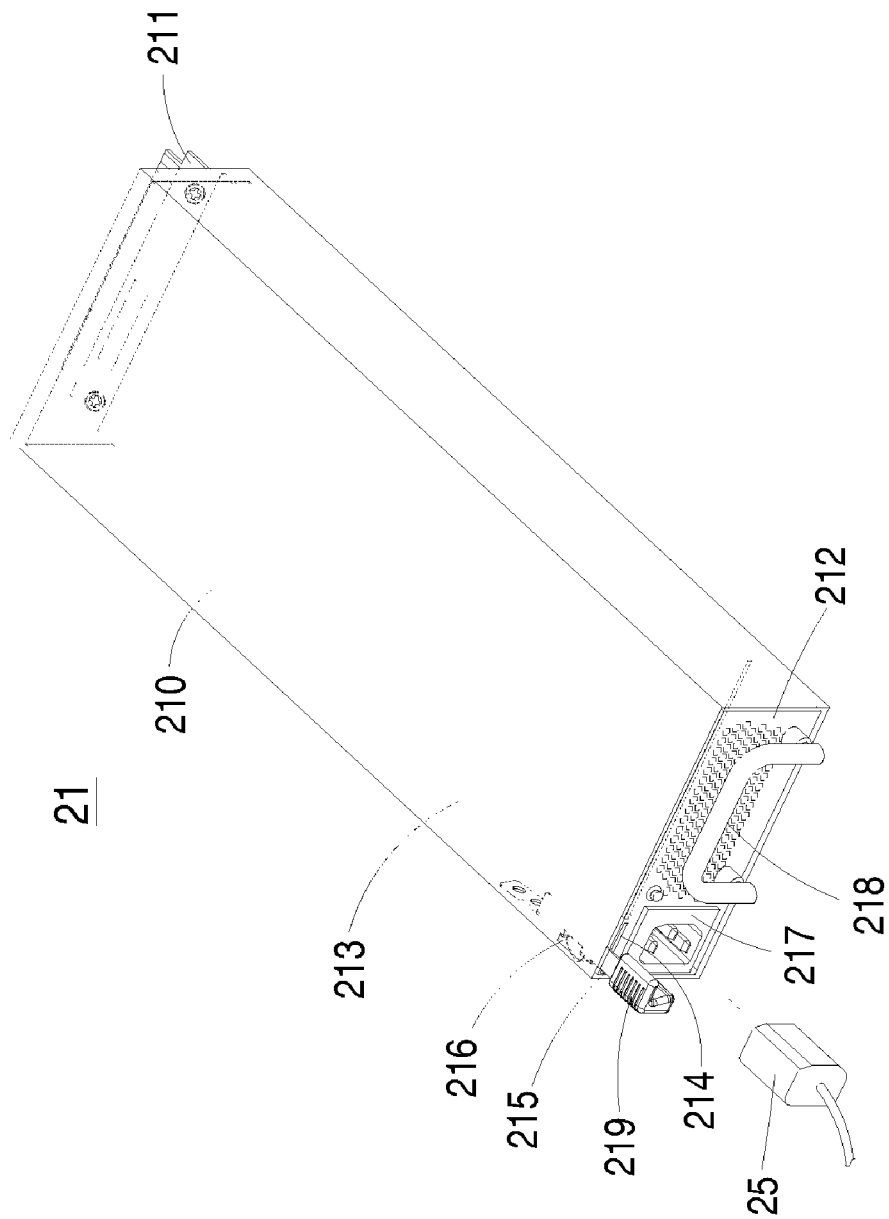
FIG. 4 is a schematic perspective view of the first power supply apparatus of FIG. 3.

Referring to FIG. 4, a schematic perspective view of the first power supply apparatus of FIG. 3 is illustrated. The configuration of the second power supply apparatus 32 is substantially identical to that of the first power supply apparatus 31. For clarification and brevity, only the first power supply apparatus 31 is described.

As shown in FIGS. 3 and 4, the first power supply apparatus 21 is swappable to be embedded into the first receptacle 202 of the system cabinet 20. The first power supply apparatus 21 principally includes a casing 210, a connecting part 211, a locking element 215, a power socket 217 and a handle 218. The casing 210 includes a first sidewall 212 and a second sidewall 213, which are adjacent to each other. In some embodiments, the first power supply apparatus 21 further includes a fan and a circuit board inside the casing 210. The first power connection interface 211 is formed on the edge region of the circuit board and extended externally from the casing 210.

The power socket 217 and the handle 218 are positioned on the first sidewall 212 of the casing 210. The first sidewall 212 and the second sidewall 213 further include a first opening 214 and a second opening 216, respectively. In response to a pulling force exerted on the handle 218, the first power supply apparatus 21 may be withdrawn from the system cabinet 20 of the redundant power supply system 2. In a case that a power plug (not shown) is inserted into the power socket 217, external electricity will be transmitted to the power socket 217 through an external power cable (not shown) and the plug.

Figure 5:
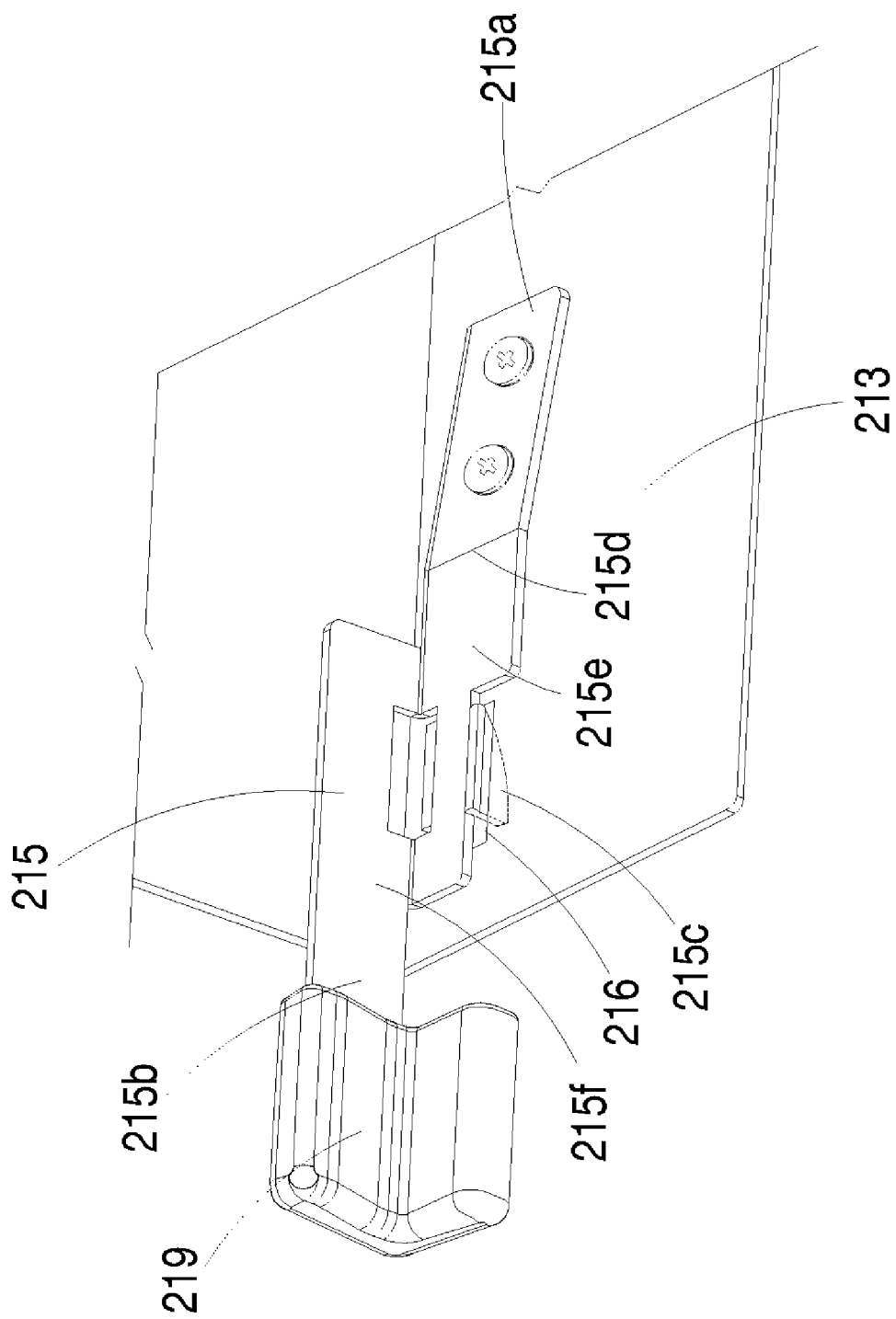
FIG. 5 is a schematic partial perspective view illustrating the locking element of FIG. 4.

FIG. 5 is a schematic partial perspective view illustrating the locking element of FIG. 4. The locking element 215 is fixed on the inner surface of the second sidewall 213 of the casing 210. Please refer to FIGS. 4 and 5. The locking element 215 principally includes a first end part 215a, a second end part 215b, a protrusion part 215c and a bent part 215d. The protrusion part 215c is arranged between the first end part 215a and the second end part 215b. The bent part 215d is arranged between the first end part 215a and the protrusion part 215c. The first end part 215a is fixed on the inner surface of the second sidewall 213 of the casing 210. The protrusion part 215c is partially exposed from the second opening 216. The second end part 215b of the locking element 215 is exposed from the first opening 214 of the first sidewall 212 of the casing 210. As a consequence, the second end part 215b is served as a suppression part to be pressed by the user.

In some embodiments, the first end part 215a is attached onto the inner surface of the second sidewall 213 of the casing 210 by riveting, screwing or welding connection. The first end part 215a and the second end part 215b are positioned on a first slab 215e and a second slab 215f, respectively. An edge of the first slab 215e is partially connected to an edge of the second slab 215f. In addition, the first slab 215e and the second slab 215f are substantially perpendicular to each other. The protrusion part 215c and the bent part 215d are also formed on the first slab 215e. In some embodiments, the locking element 215 is made of metallic material. In some embodiments, the locking element 215 is an integral metallic resilient piece.

Please refer to FIGS. 3, 4 and 5 again. When the first power supply apparatus 21 is placed into the system cabinet 20 of the redundant power supply system 2, the protrusion part 215c of the locking element 215 is engaged with the receiving structure 205 of the system cabinet 20 such that the first power supply apparatus 21 is fixed in the system cabinet 20. In some embodiments, the receiving structure 205 of the system cabinet 20 is a perforation or a recess. For a purpose of withdrawing the first power supply apparatus 21, an external force is exerted on the second end part 215b of the locking element 215 (i.e. the suppression part) to have the protrusion part 215c sunken under the second opening 216. Meanwhile, the protrusion part 215c of the locking element 215 is disengaged from the receiving structure 205 of the system cabinet 20, so that the first power supply apparatus 21 may be pulled out of the system cabinet 20 in response to a pulling force exerted on the handle 218. Due to the bent part 215d of the locking element 215, the locking element 215 may provide sufficient elasticity even if a long-term or frequent locking and unlocking actions of the locking element 215. Under this circumstance, the problem of causing distortion at the intermediate portion between the first end part 215a and the protrusion part 215c will be largely reduced.

As shown in FIGS. 4 and 5, a sustaining element 219 is sheathed around the second end part 215b of the locking element 215. Alternatively, a sustaining part (not shown) may be made by punching and bending the second end part 215b of the locking element 215. For example, the sustaining element 219 or sustaining part is L-shaped. After a power plug 25 is inserted into the power socket 217, the sustaining element 219 or sustaining part will be contacted with or sustained against the power plug 25 because the locking element 215 is disposed beside the power socket 217. Meanwhile, even if an external force is exerted on the locking element 215, the locking element 215 is maintained at the locked state. As a consequence, the first power supply apparatus 21 will no longer be erroneously pulled out of the system cabinet 20 during external electricity is transmitted to the power socket 217.

From the above description, due to the bent part, the locking element of the swappable electronic device of the present invention may maintain sufficient elasticity even if a long-term or frequent locking and unlocking actions, thereby avoiding the problem of causing distortion. Moreover, since the locking element is disposed beside the power socket, the locking element and the power plug cooperatively provide foolproof mechanisms for avoiding erroneously withdrawing the power supply apparatus during external electricity is transmitted to the power socket.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device swappable to be embedded into a system cabinet, said system cabinet having a receiving structure, said electronic device comprising:
   a casing including a first sidewall and a second sidewall, which have a first opening and a second opening, respectively; and
   a locking element including a first end part, a protrusion part, a bent part and a second end part, wherein said first end part is fixed on an inner surface of said second sidewall of said casing, said protrusion part is partially exposed from said second opening to be engaged with said receiving structure of said system cabinet, said bent part is arranged between said first end part and said protrusion part, said first end part and said second end part are positioned on a first slab and a second slab, respectively, and said second end part is exposed from said first opening so as to be protruded from said first sidewall of said casing.

2. The electronic device according to claim 1 wherein said electronic device is a power supply apparatus, and said system cabinet is included in a redundant power supply system.

3. The electronic device according to claim 1 wherein said protrusion part is arranged between said second end part and said bent part.

4. The electronic device according to claim 1 wherein a sustaining element is further sheathed around said second end part of said locking element.

5. The electronic device according to claim 1 wherein said locking element is made of metallic material.

6. The electronic device according to claim 1 wherein said locking element is an integral metallic piece.

7. The electronic device according to claim 1 wherein said protrusion part and said bent part are formed on said first slab.

8. The electronic device according to claim 1 wherein an edge of said first slab is partially connected to an edge of said second slab, and said first slab and said second slab are substantially perpendicular to each other.

9. The electronic device according to claim 1 wherein said receiving structure of said system cabinet is a perforation or a recess.

10. The electronic device according to claim 1 further comprising a power socket in said first sidewall of said casing.

11. An electronic device swappable to be embedded into a system cabinet, said system cabinet having a receiving structure, said electronic device comprising:
  a casing including a first sidewall and a second sidewall, which have a first opening and a second opening, respectively;
  a locking element including a first end part, a protrusion part, a bent part and a second end part, wherein said first end part is fixed on an inner surface of said second sidewall of said casing, said protrusion part is partially exposed from said second opening to be engaged with said receiving structure of said system cabinet, said bent part is arranged between said first end part and said protrusion part, said first end part and said second end part are positioned on a first slab and a second slab, respectively, and said second end part is exposed from said first opening so as to be protruded from said first sidewall of said casing; and
  a power socket disposed in said first sidewall of said casing and beside said locking element, wherein when a power plug is inserted into said power socket, said locking element is sustained against said power plug.

12. The electronic device according to claim 11 wherein said electronic device is a power supply apparatus, and said system cabinet is included in a redundant power supply system.

13. The electronic device according to claim 11 wherein said protrusion part is arranged between said second end part and said bent part.

14. The electronic device according to claim 11 wherein a sustaining element is further sheathed around said second end part of said locking element.

15. The electronic device according to claim 11 wherein said locking element is an integral metallic piece.

16. The electronic device according to claim 11 wherein said protrusion part and said bent part are formed on said first slab.

17. The electronic device according to claim 11 wherein an edge of said first slab is partially connected to an edge of said second slab, and said first slab and said second slab are substantially perpendicular to each other.

18. The electronic device according to claim 11 wherein said receiving structure of said system cabinet is a perforation or a recess.

* * * * *